United States Patent [19]
Kishino et al.

[11] 4,325,064
[45] Apr. 13, 1982

[54] DRIVING CIRCUIT FOR A FLUORESCENT DISPLAY APPARATUS HAVING FEWER LEADS

[75] Inventors: Takao Kishino; Toshihiro Yamaguchi; Kazunori Tanaka, all of Mobara, Japan

[73] Assignee: Futaba Denshi Kogyo K.K., Mobara, Japan

[21] Appl. No.: 98,690

[22] Filed: Nov. 29, 1979

[30] Foreign Application Priority Data

Nov. 30, 1978 [JP] Japan ............................ 53-163766[U]

[51] Int. Cl.³ ................................................ G09G 3/00
[52] U.S. Cl. ..................................... 340/753; 340/804; 340/771
[58] Field of Search ................ 340/753, 754, 804, 758, 340/771

[56] References Cited

U.S. PATENT DOCUMENTS

| 3,194,003 | 7/1965 | Polin | 368/72 |
|---|---|---|---|
| 3,805,029 | 4/1974 | Borisov et al. | 235/92 EA |
| 3,895,371 | 7/1975 | Kaji et al. | 340/753 |
| 4,095,414 | 6/1978 | Reich | 368/83 |
| 4,178,593 | 12/1979 | Kishino et al. | 340/753 |
| 4,216,470 | 8/1980 | Kishino et al. | 340/753 |
| 4,242,980 | 1/1981 | Go | 340/753 |

Primary Examiner—Marshall M. Curtis
Attorney, Agent, or Firm—Oblon, Fisher, Spivak, McClelland & Maier

[57] ABSTRACT

A fluorescent display apparatus having a plurality of anodes linearly arranged and divided into consecutive several groups each containing the same number of anodes. Each of the anodes disposed in corresponding positions of the respective anode groups is electrically connected in parallel, and a control grid is provided in each of the anode groups in an opposed relation. A particular anode representing the value of an input signal is illuminated by energizing one of the anodes in the respective anode groups and one of the control grids.

3 Claims, 4 Drawing Figures

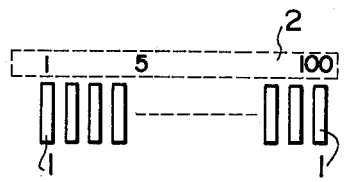
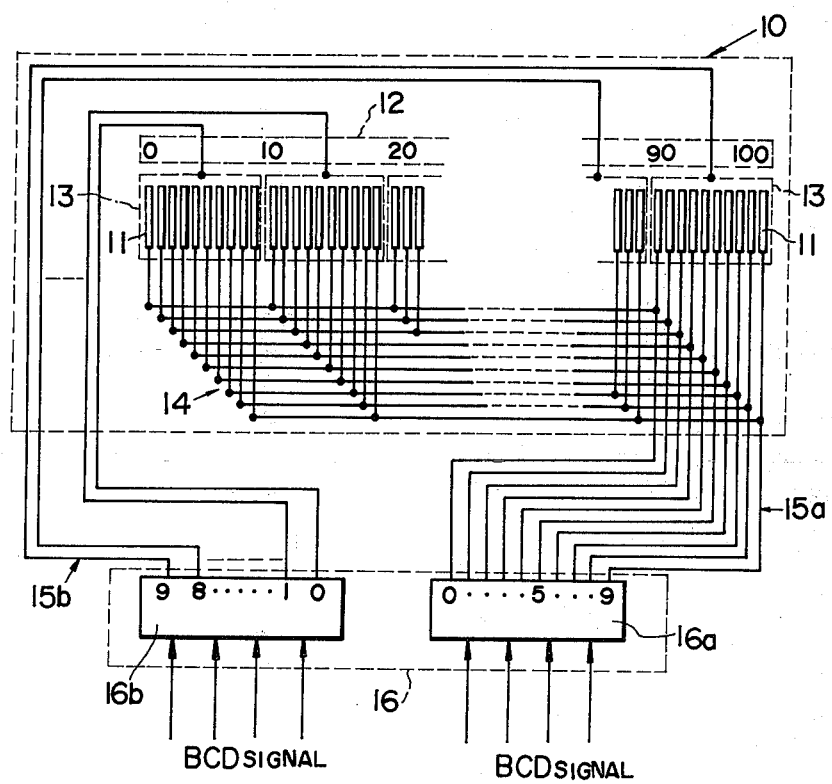

DRIVING CIRCUIT FOR A FLUORESCENT DISPLAY APPARATUS HAVING FEWER LEADS

BACKGROUND OF THE INVENTION

1. Field of the Invention

This invention generally relates to a display apparatus, and more particularly to a fluorescent display apparatus suitable for indicating a frequency in a wireless telegraphic apparatus, a numerical value in measuring instruments or the like.

2. Description of the Prior Arts

In the conventional radio receiver or the like, the frequency received by the radio receiver is indicated by a moving pointer which moves mechanically using a driving mechanism along a dial or scale on which calibrations of frequency are shown.

Recently, with the development and practical use of various display elements, an indicating apparatus, such as, for example, a frequency indicating device explained above, in the form of an electronic device has come into actual use. The electronic indicating device remarkably improves such various deficiencies in the mechanical indicating apparatus such as not being strong enough to withstand external shock, being fragile, requiring more mounting space, and being difficult to read the calibrations at night or in a dark place.

The electronic indicating apparatus includes, as shown in FIG. 1, display elements 1 which may be made of light emitting diodes, anodes having deposited phosphor layers thereon to emit light upon impingement of electrons, or discharge cells which are filled with ionizable gas and emit light by gas discharge. The display elements 1 are linearly or curvedly arranged, and the calibrations 2 which may be made of display elements similar to the elements 1 are provided adjacent to the display elements 1. The display is effected by energizing a predetermined display element among the linearly or curvedly arranged display elements in accordance with an input signal to be displayed.

However, in the conventional display apparatus of this type, it is necessary to extend a number of lead wires corresponding to the number of the display elements 1 out of an envelope of the display apparatus, because the display is effected by selectively energizing one of the display elements related to the input signal. Thus, there must be provided an increased number of lead wires and driving sections for energizing each of the display elements separately, which make it difficult to effect minute display in the display device and increases the manufacturing costs.

In other words, it is difficult to increase the number of the display elements 1 arranged on the display apparatus in order to enhance the resolution of the display, and also it is difficult to make the display range wide.

A static driving system and a dynamic driving system for such a display are known. The static driving system drives the display apparatus by applying a drive signal individually to each of the display elements 1 as explained above. The dynamic driving system effects the display by applying a display signal to the display elements 1 which are divided into consecutive groups with connections between the corresponding positions of each of the groups and by scanning each group of the anodes with pulse signals.

In the dynamic driving system, it is possible to significantly decrease the number of lead wires which come out of the envelope of the display device. However, this system is not acceptable as a driving system of communication appliances or measuring instruments, because the scanning pulses for each group of the anodes create noise in the adjacent communication appliances or measuring instruments and cause the malfunction of these appliances.

BRIEF SUMMARY OF THE INVENTION

Therefore, the present invention is intended to eliminate the above-mentioned disadvantages of the prior art.

It is an object of the present invention to provide a fluorescent display apparatus which is capable of being driven at relatively low voltage and is low in power consumption, and yet capable of obtaining a green luminous color which is extremely easy to observe, or capable of obtaining an optional luminous color.

It is another object of the present invention to provide a fluorescent display apparatus which includes fewer lead wires extending outside the envelope of the display device similar to a dynamic driving system and is capable of illuminating a particular display element which is related to an input signal without causing any hazardous noise to adjacent electric appliances.

According to the present invention, the foregoing and other objects are attained by providing a fluorescent display apparatus in which a plurality of anodes each coated with a phosphor layer on the upper surfaced thereof are linearly arranged and divided into several consecutive groups each containing the same number of anodes. Each of the anodes disposed in corresponding positions of the respective anode groups is electrically connected in parallel, and a control electrode is mounted above each of the anode groups. The fluorescent display apparatus further includes a first decoder for decoding the least significant digit of an input signal to be displayed and for applying the same to each of the corresponding anodes in the respective anode groups, and a second decoder for decoding a more significant digit of the input signal and for applying the same to any one of the control electrodes so that the particular anode representing the value of the input signal which is selected by the first and second decoders may be illuminated.

BRIEF DESCRIPTION OF DRAWINGS

Other objects and many of the attendant advantages of this invention will be readily appreciated as the same becomes better understood by reference to the following detailed description when considered in connection with the accompanying drawings, in which like reference characters designate the same or similar parts throughout the figures thereof and wherein:

FIG. 1 is a schematic diagram illustrating an arrangement of display elements in a fluorescent display apparatus according to the present invention;

FIG. 2 is a block schematic diagram showing an embodiment of a fluorescent display apparatus according to the present invention;

DETAILED DESCRIPTION OF THE PREFERRED EMBODIMENT

Figure 3:
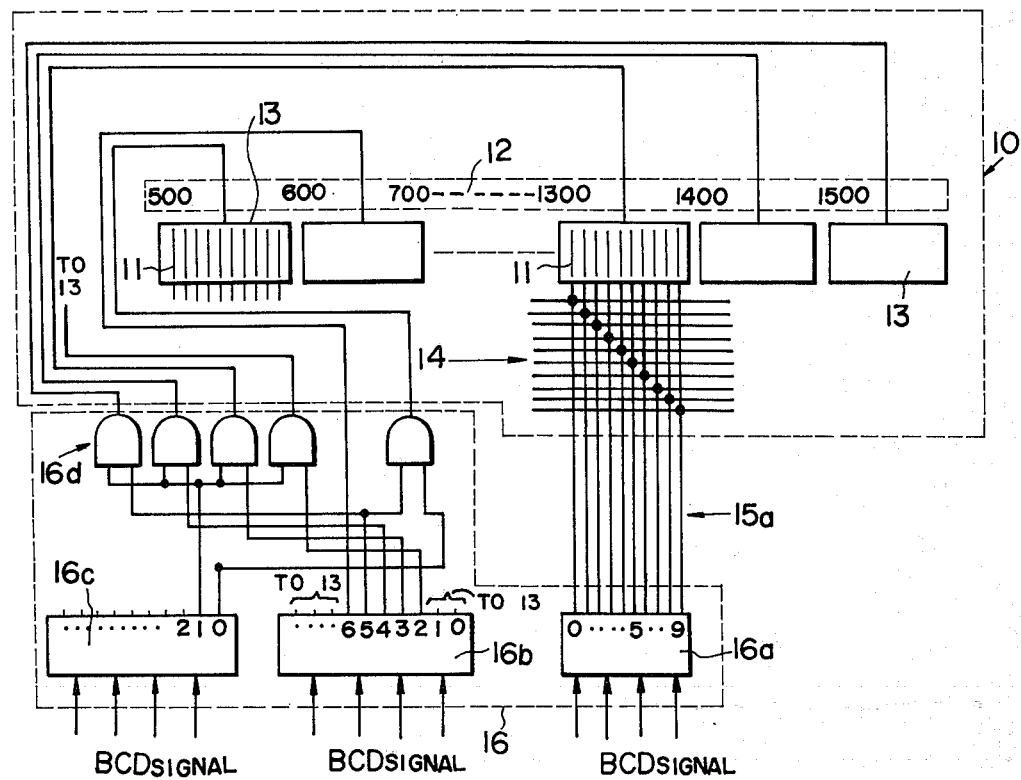
FIG. 3 is a block schematic diagram showing another embodiment of a fluorescent display apparatus according to the present invention.

A fluorescent display device according to the present invention will be hereinafter described with reference to the accompanying drawings.

FIG. 2 is a block diagram showing an embodiment of a fluorescent display apparatus according to the present invention. In this embodiment, one hundred display elements are linearly arranged so that a predetermined display element corresponding to one of the numerals, "0" to "99" may be illuminated. In the fluorescent display apparatus shown in FIG. 2, an input signal is applied to the apparatus by a BCD signal.

In FIG. 2, the fluorescent display apparatus generally indicated by the reference numeral 10 includes an insulating substrate (not shown) on which one hundred anodes 11 having fluorescent layers deposited thereon are linearly arranged. Reference numeral 13 grids which are mounted opposite to a certain number of the anodes 11 (ten anodes in the embodiment shown in FIG. 2) and which are electrically isolated from one another. In addition, there is provided a filamentous cathode (not shown) above the grids 13 which emits thermions when energized and heated.

Reference numeral 12 indicates a graduated scale as a reference for the numeral of the illuminated anode 11. Reference numeral 14 designates inner leads for connecting each of the electrodes. The inner leads 14 connect each of the anodes disposed in corresponding portions of the respective grids 13 together, which are in turn connected to outer leads 15a for leading out of the display apparatus. Each of the grids 13 is led out of the display apparatus by the respective outer leads 15b.

These electrodes and inner leads are hermetically sealed within a vacuum emvelope having a transparent viewing window so as to form the fluorescent display apparatus 10.

The fluorescent display apparatus 10 explained hereinabove is of a structure to which the conventional dynamic driving system is applied. According to this driving system, the fluorescent display apparatus may be provided with fewer external terminals 15a and 15b equal to the sum of the number of the grids 13, the number of the anodes 11 of each grid 13, and the number of the leads for supplying electric power to the cathode.

Reference numeral 16 is a signal converting section for converting an input signal given by the BCD signal into a driving signal for the fluorescent display apparatus 10. In this embodiment, the signal converting section 10 includes a first and second decoders 16a and 16b for converting a more significant digit and the least significant digit of the input signal into a decimal numeral, respectively.

According to the above construction, when the input signal to be displayed is given to the signal converting section 16, the numerical value of the least significant digit of the input signal is decoded by the decoder 16a, and the driving signal is supplied to any one of terminals, "0" to "9" which is connected to the anodes 11 of each grid 13.

On the other hand, the numerical value of the more significant digit of the input signal is decoded by the decoder 16b, and any one of ten grids 13 is selected. Then, electrons emitted from the cathode are impinged upon only the anode 11 selected by the decoder 16a and subjected to the grid 13 which is selected by the decoder 16b, thereby to illuminate the particular anode 11 corresponding to the numerical value of the input signal.

According to the fluorescent display apparatus of the present invention which uses the dynamic driving system, it is possible to eliminate a number of the outer leads 15a and 15b, which results in an increase of the number of anodes 11 arranged on the substrate. As a result, resolution of the display is significantly increased, and the display range can be widened. In addition, the number of the driving circuits can be decreased.

The fluorescent display device according to the present invention does not generate any signal which causes external appliance noises, because the fluroescent display apparatus 10 is driven without using a pulse. Therefore, it is extremely suitable for an indicating portion of various communication appliances, measuring instruments, and the like.

Reference will now be made to a practical example in which the indicating apparatus of the present invention is used as a frequency indicator of the medium wave radio receiver shown in FIG. 3.

In general, the medium wave radio receiver receives frequencies of 535–1605 KHZ. Therefore, it is necessary to provide at least eleven grids 13 to cover all of the frequencies.

In the embodiment shown in FIG. 3, a signal converting section 16 is formed of a decoder 16a for decoding the numerical value of the least significant digit of the input signal (the numerical value of ten figures is the least signficant digit in this case), two decoders 16b and 16c for decoding the numerical value of the more significant digits, and an "AND" circuit 16d for selecting a predetermined grid 13 from two output signals generated by the decoders 16b and 16c. The "AND" circuit 16d selects either a combination of "0" signal from the decoder 16c and "5" signal from the decoder 16b or a combination of "1" signal from the decoder 16c and "0"–"5" from the decoder 16b and energizes the corresponding grid 13. "6"–"9" signals from the decoder 16 are applied to the corresponding grids 13 not through the "AND" circuit 16d.

According the embodiment shown in FIG. 3, when the input signal to be displayed is applied to the signal converting section 16, the numerical value of the least significant digit of the input signal is decoded by the decoder 16a, and the driving signal is supplied to any one of terminals, "0" to "9" and one of the anodes 11 of each grid 13 is selected. On the other hand, the numerical value of the more significant digits of the input signal is decoded by the two decoders 16b and 16c, and the signals from the decoders 16b and 16c are transmitted to the "AND" circuit 16d in which any one of eleven grids 13 is selected. Then, electrons emitted from the cathode are impinged only upon the anode 11 selected by the decoder 16a and subjected to the grid 13 which is selected by the "AND" circuit 16d, thereby to illuminate the particular anode 11 corresponding to the numerical value of the input signal. In this embodiment, the unidecimal decoder can be formed by the two decoders 16b and 16c and the "AND" circuit 16d, because four bits binary code decoder is used in this invention.

Figure 4:
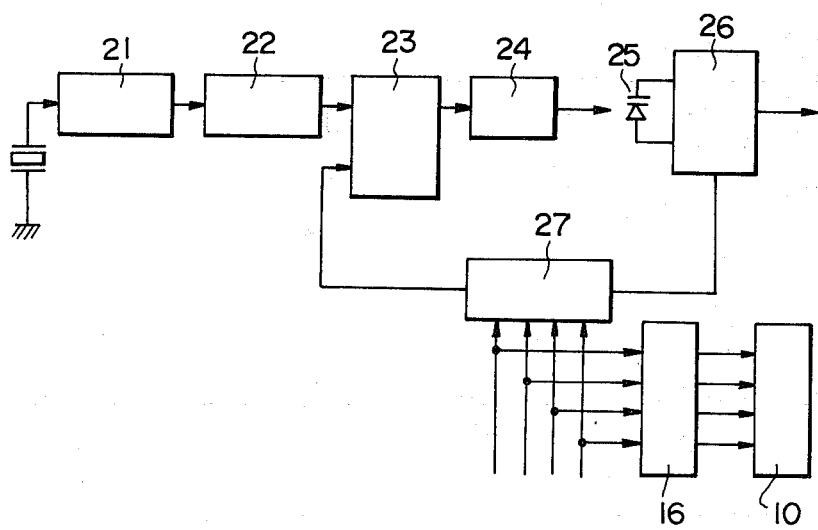
FIG. 4 is a block schematic diagram illustrating an application of a fluorescent display apparatus according to the present invention.

Referring now to an embodiment in which the indicating apparatus of the present invention is incorporated into a frequency tuning circuit of radio receiver shown in FIG. 4, the frequency tuning circuit is made up of a PLL (Phase Locked Loop) frequency synthesizer comprising a reference oscillator 21 using a quartz oscillator as a local oscillating circuit, a frequency demultiplier 22, a phase detector 23, a low pass filter 24, a variable capacity diode 25, a voltage control oscillator 26 for regulating the oscillating frequency in response to a voltage applied to the variable capacity diode 25, and a programmable counter 27 for receiving a set signal. In this apparatus, the tuning of the intended frequency can be correctly indicated by introducing the set signal of the programmable counter 27 into a signal indicating portion 16 in order to decode the signal into a driving signal for the fluorescent display apparatus.

As explained above, the fluorescent display apparatus according to the present invention includes a plurality of anodes divided into consecutive groups, and each of the anodes disposed in corresponding portions of the respective groups is electrically connected in common similar to the fluorescent display tube driven by the dynamic driving system. Therefore, the number of the lead wires extended to the outside of the vacuum casing can be minimized, which results in the increase of the number of anodes arranged on the substrate. Thus, resolution of the display is significantly increased, and also the display range can be widened. In addition, the fluorescent display apparatus according to the present invention can be driven with a simple circuit including fewer driving circuits for each of the anodes. This is advantageous in view of the manufacturing costs. Furthermore, the fluorescent display apparatus according to the present invention does not require high frequency scanning pulses to drive the apparatus similar to the static driving system. Thus, unnecessary electric waves which induce noise in adjacent electric appliances are not generated from the display apparatus. Accordingly, even when it is used as an indicating portion of various communication appliances, audio appliances, measuring instruments, and the like, there is no fear of generating hazardous noises.

Obviously, many modifications and variations of the present invention are possible in the light of the above teachings. It is therefore to be understood that within the scope of the appended claims, the invention may be practiced otherwise than as specifically described.

What is claimed as new and desired to be secured by Letters Patent of the United States is:

1. A fluorescent display apparatus comprising:
   a vacuum casing made up of a substrate and a front cover airtightly bonded together;
   a plurality of anodes each coated with a phosphor layer on the upper surfaces thereof and disposed on said substrate;
   said anodes being divided into consecutive several groups so as to include a certain number of anodes in each of said anode groups;
   each of said anodes disposed in corresponding positions of said respective anode groups being connected together in parallel;
   a plurality of control electrodes each provided in an opposite relationship with respect to said respective anode groups;
   a filamentary cathode stretched above said control electrodes for emitting thermions when energized and heated;
   a first decoder means for decoding the least significant digit of an input signal and thereby selecting a plurality of anodes having corresponding positions in said respective anode groups; and
   a second decoder means for decoding at least two more significants digits of said input signal and, thereby selecting one of said control electrodes whereby one of said anodes selected by said first and second decoders representing the value of said input signal is illuminated;
   wherein said second decoder means includes a first decoder and a second decoder for receiving said at least two more significant digits and a plurality of AND gates said AND gates each having a first input connected to one output of said first decoder and a second input connected to the output of said second decoder.

2. The fluorescent display apparatus as defined in claim 1, wherein said AND gates include a first gate having inputs connected to said first and second decoders so as to indicate that the number 5 is present in said first and second decoder, a second AND gate connected to said first and second decoders to indicate that the number 12 is present in said first and second decoders, a third AND gate connected to said first and second decoder to indicate that the number 13 is present in the first and second decoders, a fourth AND gate connected to said first and second decoders to indicate that number 14 is present in said first and second decoders and a fifth AND gate connected to said first and second decoders to indicate that the number 15 is present in said first and second decoders.

3. The fluorescent display apparatus as defined in claim 1, wherein said anodes and said cathodes are arranged in a linear array and wherein the inputs to said AND gates are connected to selected outputs of said first and second decoders so as to achieve an indexing and truncation of the total possible range of numbers available from said first and second decoders.

* * * * *